United States Patent
Hung et al.

(10) Patent No.: US 9,337,869 B2
(45) Date of Patent: May 10, 2016

(54) ENCODING AND SYNDROME COMPUTING CO-DESIGN CIRCUIT FOR BCH CODE AND METHOD FOR DECIDING THE SAME

(71) Applicant: Storart Technology Co., Ltd., Hsinchu (TW)

(72) Inventors: Jui Hui Hung, Hsinchu (TW); Chih Nan Yen, Hsinchu (TW)

(73) Assignee: Storart Technology Co. Ltd., Hsinchu (TW)

( * ) Notice: Subject to any disclaimer, the term of this patent is extended or adjusted under 35 U.S.C. 154(b) by 129 days.

(21) Appl. No.: 14/265,929

(22) Filed: Apr. 30, 2014

(65) Prior Publication Data

US 2015/0318869 A1    Nov. 5, 2015

(51) Int. Cl.
*H03M 13/00* (2006.01)
*H03M 13/15* (2006.01)

(52) U.S. Cl.
CPC .......... *H03M 13/152* (2013.01); *H03M 13/157* (2013.01)

(58) Field of Classification Search
CPC ............... G11B 20/1886; G11B 20/10527; G06F 11/0793
See application file for complete search history.

(56) References Cited

U.S. PATENT DOCUMENTS

2010/0262894 A1* 10/2010 Swing .................. G06F 3/0613
714/782

* cited by examiner

*Primary Examiner* — Guy Lamarre
(74) *Attorney, Agent, or Firm* — Che-Yang Chen; Law Offices of Scott Warmuth (57) ABSTRACT

An encoding and syndrome computing co-design circuit for BCH code and a method for deciding the circuit are disclosed. The method includes the steps of: building up matrices of $X_R$, $X_G$ and $X_S$ according to p parallel computations and 2t syndromes; building up $F^P$; building up F'; building up F"; building up matrix of $[X_{SRG} F"]$; and designing a circuit which fulfills the operation of $[X_{SRG} F"]$.

8 Claims, 7 Drawing Sheets

ENCODING AND SYNDROME COMPUTING CO-DESIGN CIRCUIT FOR BCH CODE AND METHOD FOR DECIDING THE SAME

FIELD OF THE INVENTION

The present invention relates to a co-design circuit and a method for deciding the circuit. More particularly, the present invention relates to a co-design circuit for BCH code encoding and syndrome computing and a method for deciding the circuit.

BACKGROUND OF THE INVENTION

Figure 1:
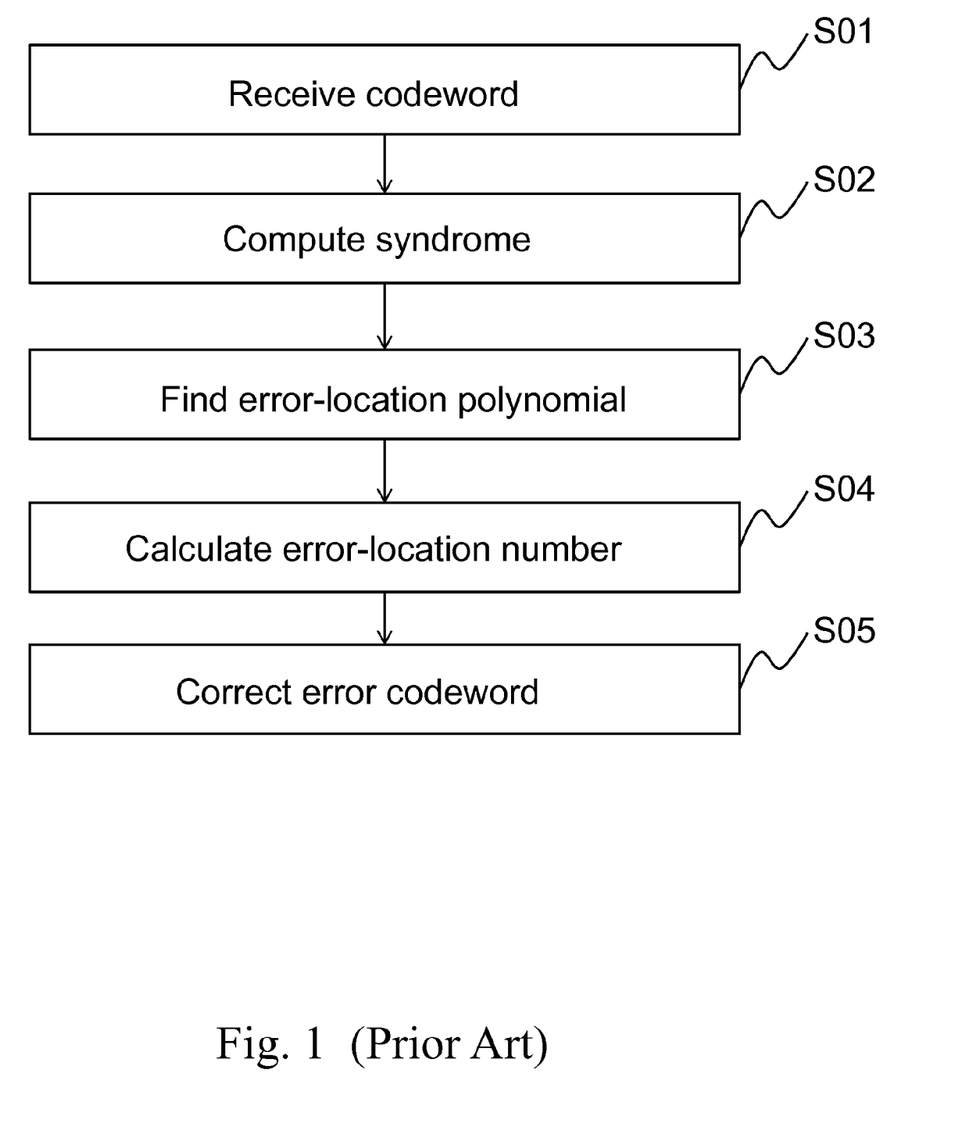
FIG. 1 is conventional decoding processes for BCH code.

Bose-Chaudhuri-Hocquenghem (BCH) code is one of the most widely used error correction code (ECC) techniques in the storage and communication devices. BCH code can detect and correct random errors occurred due to channel noises and defects within memory devices. The encoding procedures of BCH codeword can be implemented by linear feedback shift register (LFSR) and some combination logics together. Comparing with encoding procedures of the BCH codewords, decoding procedures of the BCH codewords are much complicated as shown in FIG. 1. Decoding procedures are as below: After receiving a codeword (S01), in order to decode it, one should compute a syndrome according to specified polynomials (S02). Then, depending on the syndrome, an error-location polynomial can be found (S03). Next, by calculating the roots of the error-location polynomial, error-location numbers can be obtained (S04). Finally, an erroneous codeword can be corrected by above steps (S05).

Figure 2:
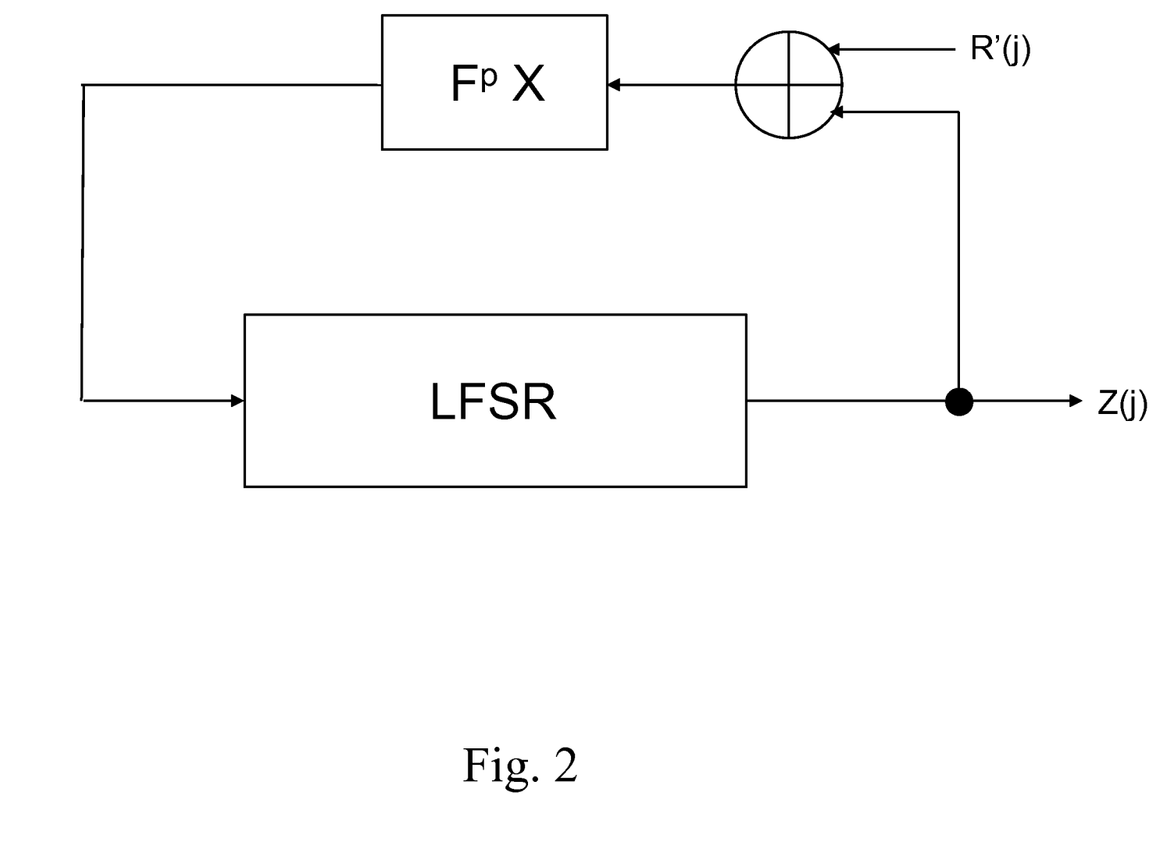
FIG. 2 shows a prior art circuit design of a linear feedback shift register.

A conventional linear feedback shift register circuit is shown in FIG. 2. In order to speed up operation, the circuit is often designed to be parallelization. It can calculate several inputted bit datum at the same time. The alphabet p in FIG. 2 represents the p-bit datum of the inputted R'(j) in the $j^{th}$ clock for synchronized calculation. After encoding, the results of Z(j) are outputted. If the code length is n bits, the procedures of encoding will complete after [n/p] clocks.

Figure 3:
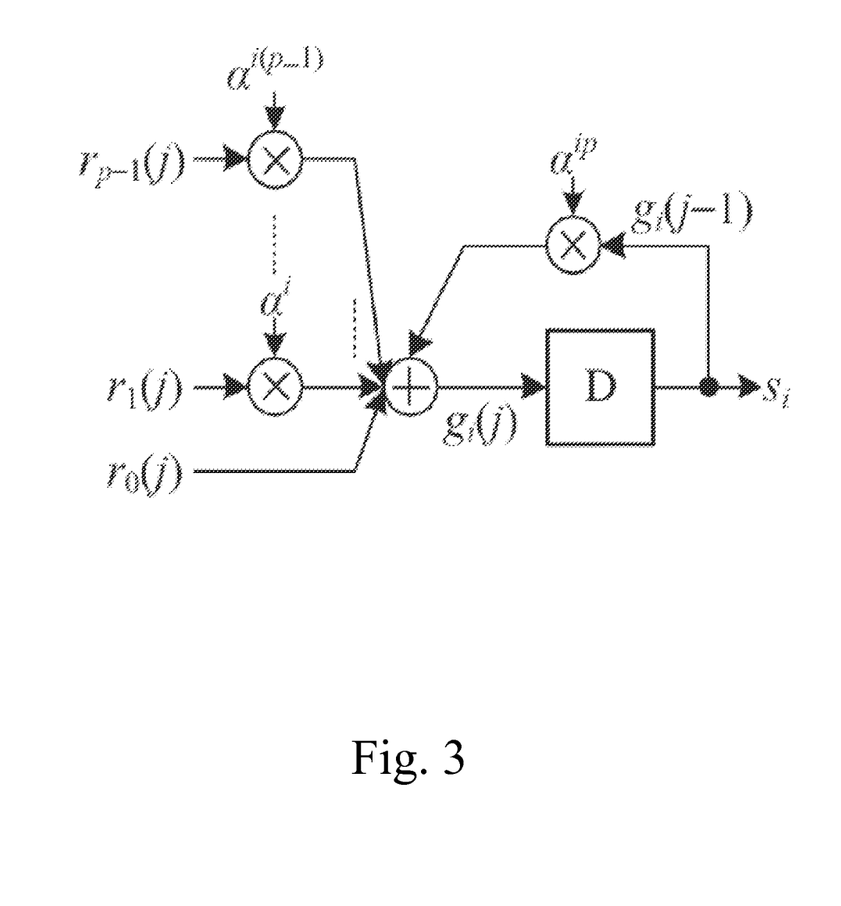
FIG. 3 shows a convention a syndrome computing unit.

In a BCH decoder, there are some similar architectures of iterative calculation. For example, the syndrome computing unit. For a syndrome computing unit having error correcting ability t, each syndrome $S_i$ can be found by the equation below:

$$S_i = r(\alpha^{i+1}) = \sum_{j=0}^{n-1} r_j (\alpha^{i+1})^j,$$

$$(i = 1 \ldots t)$$

r(αi+1) represents a received codeword polynomial. In order to implement the equation above, a commonly seen decoding circuit will include the syndrome computing unit for corresponding processes. A conventional syndrome computing unit is shown in FIG. 3. Similar to the aforementioned encoder, in FIG. 3, Numeral p is the number of bits received in one clock (p parallel computations). $g_i(j)$ is an intermediate data of the $j^{th}$ iterative operation.

The above equation can be presented in form of a matrix. Hence, common sub-expressions can be found during derivation processes. For implement of circuitry, by sharing proper hardware, the common sub-expressions can be saved. Meanwhile, the target of lowering hardware complexity can be achieved. In addition, since the encoder of the BCH code runs by using similar iterative operation, if encoding and decoding are not required to process at the same time, the encoder and syndrome computing unit can share the same registers. It further saves area cost. Many prior arts disclose such design, for example, U.S. Pat. No. 6,405,339, U.S. Pat. No. 7,743,311, U.S. Pat. No. 8,418,021, etc. However, the hardware complexities provided by those patents are still too high. For compact designed electronic devices, there is still room for improvement.

SUMMARY OF THE INVENTION

As mentioned above, among the solutions of co-design circuits for BCH encoding and syndrome computing, hardware complexity is higher and area cost is large. Therefore, a proper co-design circuit to lower hardware complexity is desperately desired. It is better for the circuit to efficiently reduce common sub-expressions in BCH encoding and syndrome computing.

According to an aspect of the present invention, a co-design circuit for BCH encoding and syndrome computing, capable of processing p parallel computation includes: an encoding unit, for encoding one message having k bits as one BCH codeword having n bits after processing a first iterative operation, the first iterative operation being processed to receive p bits sequentially in each clock and output the BCH codeword after [n/p] clocks; a syndrome computing unit, for obtaining 2t syndromes each having m bits from one BCH codeword having n bits after processing a second iterative operation, the second iterative operation being processed to receive p bits sequentially in each clock and output the syndromes after [n/p] clocks; a number of multiplexers, each being used to receive a first intermediate computing result generated from the first iterative operation and a second intermediate computing result generated from the second iterative operation, wherein when the first iterative operation processes, the first intermediate computing result is outputted, and when the second iterative operation processes, the second intermediate computing result is outputted; and a number of registers, each being used to receive the first intermediate computing result or the second intermediate computing result from a corresponding multiplexer, or the second intermediate computing result from a syndrome computing unit, and outputting the first intermediate computing result to the encoding unit or the second intermediate computing result to the syndrome computing unit in a later clock after the first intermediate computing result or the second intermediate computing result is received. Numeral k, n, p and t are positive integers and n is greater than k. Numeral m is the power of 2 over $GF(2^m)$.

Preferably, the first iterative operation is processed to obtain computed values of Z(j) and a complete BCH codeword. Z(j) is expressed as below: $Z(j)=F^p \times [Z(j-1)+R'(j)]$, where all elements in Z(0) are 0, $$R'(j) = [\, r'_0(j) \;\; r'_1(j) \;\; r'_2(j) \;\; \ldots \;\; r'_{p-1}(j) \,|\, 0 \;\; \ldots \;\; 0 \,]^T_{1 \times R},$$

$$F^p = \left[ F^{p-1} \times \begin{bmatrix} g'_{R-1} \\ g'_{R-2} \\ \vdots \\ g'_1 \\ g'_0 \end{bmatrix} \middle| \text{ first } R-1 \text{ columns of } F^{p-1} \right],$$

$$F^1 = \begin{bmatrix} g'_{R-1} & 1 & 0 & \cdots & 0 \\ g'_{R-2} & 0 & 1 & \cdots & 0 \\ \vdots & \vdots & \vdots & \vdots & \vdots \\ g'_1 & 0 & 0 & \cdots & 1 \\ g'_0 & 0 & 0 & \cdots & 0 \end{bmatrix};$$

Z(j) is the first intermediate computing results from a $j^{th}$ iterative calculation of the first iterative operation; for a n-bit initial processing data including the k-bit message and being divided per p bits, R'(j) is the $j^{th}$ p bits. R=n−k+1; $g'_{R-1}$, $g'_{R-2}$, ... and $g'_0$ are coefficients of a generating polynomial, $g(x) = x^R + g'_{R-1}x^{R-1} + g'_{R-2}x^{R-2} + \ldots + g'_2 x^2 + g'_1 x^1 + g'_0$.

Preferably, the first iterative operation satisfies operation of a matrix F'', where $$F'' = \begin{bmatrix} F'^T \\ 0 \end{bmatrix}_{(P+mt) \times Rt},$$

$F' = [\text{first } p \text{ columns of } F^p \mid F^p]$;

m is a positive integer.

Preferably, the second iterative operation is processed to obtain computed values of G(j) and complete syndromes, wherein $$[S(j)G(j)] = [R(j)G(j-1)] \times \begin{bmatrix} 0 & X_R \\ X_S & X_G \end{bmatrix} = [R(j)G(j-1)] \times X_{SRG},$$

where $G(j) = [g_1(j) \ g_3(j) \ \ldots \ g_{2t-1}(j)]$; G(j) represents m×t second intermediate computing results from a $j^{th}$ iterative calculation of the second iterative operation, $R(j) = [r_0(j) \ r_1(j) \ \ldots \ r_{p-1}(j)]$, R(j) represents p bits of the codeword received by the syndrome computing unit in the $j^{th}$ iterative calculation; S(j) represents outputted computed values of syndromes in the $j^{th}$ iterative calculation; $X_R$ is a p×mt binary matrix; X is a mt×mt binary matrix; $X_S$ is a mt×2mt binary matrix.

Preferably, the $X_R$, $X_G$ and $X_G$ are defined as:
$X_R = [C_1 \ C_3 \ \ldots \ C_{2t-1}]$, where $$C_{2t-1} = \begin{bmatrix} \alpha_0^0 & \alpha_1^0 & \cdots & \alpha_{m-1}^0 \\ \alpha_0^{2t-1} & \alpha_1^{2t-1} & \cdots & \alpha_{m-1}^{2t-1} \\ \vdots & \vdots & \ddots & \vdots \\ \alpha_0^{(p-1)(2t-1)} & \alpha_1^{(p-1)(2t-1)} & \cdots & \alpha_{m-1}^{(p-1)(2t-1)} \end{bmatrix},$$

$$X_G = \begin{bmatrix} A_{1p} & 0 & \cdots & 0 \\ 0 & A_{3p} & \cdots & 0 \\ \vdots & \vdots & \ddots A_{(2t-3)p} & \vdots \\ 0 & 0 & \cdots & A_{(2t-1)p} \end{bmatrix},$$

$$A_{(2t-1)p} = \begin{bmatrix} \alpha_0^{(2t-1)p} & \alpha_1^{(2t-1)p} & \cdots & \alpha_{m-1}^{(2t-1)p} \\ \alpha_0^{(2t-1)p+1} & \alpha_1^{(2t-1)p+1} & \cdots & \alpha_{m-1}^{(2t-1)p+1} \\ \vdots & \vdots & \ddots & \vdots \\ \alpha_0^{(2t-1)p+m-1} & \alpha_1^{(2t-1)p+m-1} & \cdots & \alpha_{m-1}^{(2t-1)p+m-1} \end{bmatrix},$$

$$X_S = \begin{bmatrix} I & B_2 & 0 & B_4 & 0 & 0 & \cdots \\ 0 & 0 & I & 0 & 0 & B_2 & \cdots \\ 0 & 0 & 0 & 0 & I & 0 & \cdots \\ \vdots & \vdots & \vdots & \vdots & \vdots & \vdots & \ddots \end{bmatrix}, \text{ and}$$

$$B_w = \begin{bmatrix} \alpha_0^0 & \alpha_1^0 & \cdots & \alpha_{m-1}^0 \\ \alpha_0^w & \alpha_1^w & \cdots & \alpha_{m-1}^w \\ \vdots & \vdots & \ddots & \vdots \\ \alpha_0^{(m-1)w} & \alpha_1^{(m-1)w} & \cdots & \alpha_{m-1}^{(m-1)w} \end{bmatrix},$$

wherein $\alpha_0 \ldots$ and $\alpha_{(m-1)}$ are elements in $GF(2^m)$; I is a unit matrix, $B_w$ is an operating matrix other than a zero matrix and a unit matrix; w is an positive integer of power of 2 and smaller than or equal to 2t.

Preferably, the amount of multiplexers is greater than R value of the BCH code which can be encoded by the encoding unit, where R=n−k+1. The amount of the registers is greater than or equal to m×t. The first intermediate computing result is a one bit signal and the second intermediate computing result is a one bit signal.

According to another aspect of the present invention, a method for deciding a co-design circuit for BCH encoding and syndrome computing includes the steps of: building up $X_R$, $X_G$ and $X_S$ according to p parallel computations and 2t syndromes; building up $F^P$; building up F'; building up F''; building up matrix $[X_{SRG} \ F'']$; and designing a circuit fulfilling operation of matrix $[X_{SRG} \ F'']$, wherein k, n, p and t are positive integers, n is greater than k, $X_R = [C_1 \ C_3 \ \ldots \ C_{2t-1}]$, where $$C_{2t-1} = \begin{bmatrix} \alpha_0^0 & \alpha_1^0 & \cdots & \alpha_{m-1}^0 \\ \alpha_0^{2t-1} & \alpha_1^{2t-1} & \cdots & \alpha_{m-1}^{2t-1} \\ \vdots & \vdots & \ddots & \vdots \\ \alpha_0^{(p-1)(2t-1)} & \alpha_1^{(p-1)(2t-1)} & \cdots & \alpha_{m-1}^{(p-1)(2t-1)} \end{bmatrix},$$

$\alpha_0, \ldots$ and $\alpha_{(m-1)}$ are elements in $GF(2^m)$;

$$X_G = \begin{bmatrix} A_{1p} & 0 & \cdots & 0 \\ 0 & A_{3p} & \cdots & 0 \\ \vdots & \vdots & \ddots A_{(2t-3)p} & \vdots \\ 0 & 0 & \cdots & A_{(2t-1)p} \end{bmatrix},$$

where $$A_{(2t-1)p} = \begin{bmatrix} \alpha_0^{(2t-1)p} & \alpha_1^{(2t-1)p} & \cdots & \alpha_{m-1}^{(2t-1)p} \\ \alpha_0^{(2t-1)p+1} & \alpha_1^{(2t-1)p+1} & \cdots & \alpha_{m-1}^{(2t-1)p+1} \\ \vdots & \vdots & \ddots & \vdots \\ \alpha_0^{(2t-1)p+m-1} & \alpha_1^{(2t-1)p+m-1} & \cdots & \alpha_{m-1}^{(2t-1)p+m-1} \end{bmatrix};$$

-continued $$X_s = \begin{bmatrix} I & B_2 & 0 & B_4 & 0 & 0 & \cdots \\ 0 & 0 & I & 0 & 0 & B_2 & \cdots \\ 0 & 0 & 0 & 0 & I & 0 & \cdots \\ \vdots & \vdots & \vdots & \vdots & \vdots & \vdots & \ddots \end{bmatrix},$$

where $$B_w = \begin{bmatrix} \alpha_0^0 & \alpha_1^0 & \cdots & \alpha_{m-1}^0 \\ \alpha_0^w & \alpha_1^w & \cdots & \alpha_{m-1}^w \\ \vdots & \vdots & \ddots & \vdots \\ \alpha_0^{(m-1)w} & \alpha_1^{(m-1)w} & \cdots & \alpha_{m-1}^{(m-1)w} \end{bmatrix},$$

where I is a unit matrix, $B_w$ is an operating matrix other than a zero matrix and a unit matrix, w is an positive integer of power of 2 and smaller than or equal to 2t;

$$X_{SRG} = \begin{bmatrix} 0 & X_R \\ X_S & X_G \end{bmatrix},$$

$$F'' = \begin{bmatrix} F'^T \\ 0 \end{bmatrix}_{(P+mt) \times Rt},$$

$F' = [\text{first } p \text{ columns of } F^p | F^p ]$, $$F^p = \left| F^{p-1} \times \begin{bmatrix} g'_{R-1} \\ g'_{R-2} \\ \vdots \\ g'_1 \\ g'_0 \end{bmatrix} \right| \text{first } R-1 \text{ columns of } F^{p-1} \right|,$$

$$F^1 = \begin{bmatrix} g'_{R-1} & 1 & 0 & \cdots & 0 \\ g'_{R-2} & 0 & 1 & \cdots & 0 \\ \vdots & \vdots & \vdots & \vdots & \vdots \\ g'_1 & 0 & 0 & \cdots & 1 \\ g'_0 & 0 & 0 & \cdots & 0 \end{bmatrix},$$

where R=n−k+1; $g'_{R-1}$, $g'_{R-2}$ ... and $g'_0$ are coefficients of a generating polynomial, $g(x) = x^R + g'_{R-1} x^{R-1} + g'_{R-2} x^{R-2} + \ldots + g'_2 x^2 + g'_1 x^1 + g'_0$.

DETAILED DESCRIPTION OF THE PREFERRED EMBODIMENT

The present invention will now be described more specifically with reference to the following embodiment.

First, a further illustration about BCH encoding is provided below. For an encoded BCH codeword having n bits, it includes a k-bit message. During encoding processes, a generating polynomial below is applied:

$g(x) = x^R + g'_{R-1} x^{R-1} + g'_{R-2} x^{R-2} + \ldots + g'_2 x^2 + g'_1 x^1 + g'_0$, where R=n−k+1. When an encoder capable of processing encoding of p parallel computations synchronously is used, for a n-bit initial processing data including the k-bit message and being divided per p bits as R'(1), R'(2), ... R'(n/p)(R'(n/p) is not necessary p bits), inputted to the encoder per clock sequentially for operation. In view of a general formula, in a $j^{th}$ clock (1≤j≤n/p), the outputted computed values are as: $Z(j) = F^p \times [Z(j-1) + R'(j)]$. It should be noticed that all elements in Z(0) are 0. In order to facilitate operation, it is denoted that $R'(j) = [r'_0(j) r'_1(j) r'_2(j) \ldots r'_{p-1}(j) | 0 \ldots 0]_{1 \times R}^T$.

R'(j) is the $j^{th}$ p bits. Z(j) has R bits denoting by $Z_0(j)$, $Z_1(j)$, ... $Z_{R-1}(j)$, respectively. Other expressions in the above formula are further described as below:

$$F^p = \left| F^{p-1} \times \begin{bmatrix} g'_{R-1} \\ g'_{R-2} \\ \vdots \\ g'_1 \\ g'_0 \end{bmatrix} \right| \text{first } R-1 \text{ columns of } F^{p-1} \right|$$

$$F^1 = \begin{bmatrix} g'_{R-1} & 1 & 0 & \cdots & 0 \\ g'_{R-2} & 0 & 1 & \cdots & 0 \\ \vdots & \vdots & \vdots & \vdots & \vdots \\ g'_1 & 0 & 0 & \cdots & 1 \\ g'_0 & 0 & 0 & \cdots & 0 \end{bmatrix}$$

Let $F' = [\text{first } p \text{ columns of } F^p | F^p]$, transpose of Z(j) can be obtained.

$$Z(j)^T = \{F^p \times [Z(j-1) + R'(j)]\}^T$$
$$= [Z(j-1) + R'(j)]^T \times F^{p^T}$$
$$= [R'(j) Z(j-1)] \times F'^T$$

A circuit fulfills this operation can also achieve the encoding operation shown in FIG. 2.

Come back to syndrome computing. Yungjoo Lee et al. disclosed a paper on IEEE International Journal in 2012, titled "mall-area parallel syndrome calculation for strong BCH decoding" where a method for syndrome computing unit, capable of searching for common sub-expressions was discussed. According to the paper, a syndrome computing unit with p syndrome parallel computations needs [n/p] clocks to finish syndrome computing. It is also includes 2t sub-units for generating 2t syndromes synchronously. In the $j^{th}$ clock, the syndrome S(j) computed from the syndrome computing unit can be expressed as:

$$[S(j)G(j)] = [R(j)G(j-1)] \times \begin{bmatrix} 0 & X_R \\ X_S & X_G \end{bmatrix} = [R(j)G(j-1)] \times X_{SRG}$$

In the above formula, $S(j)$ is a $1 \times 2mt$ binary matrix, representing $2t$ computed values of syndromes in the $j^{th}$ iterative calculation. Each computed value of the syndrome has m bits. Numeral m is a non-zero positive integer and is the power of 2 over $GF(2^m)$. $G(j)$ is a $1 \times mt$ binary matrix, representing $m \times t$ temporary intermediate computing results in the $j^{th}$ iterative calculation. $G(j)$ can be expressed as below:

$$G(j) = [g_1(j) g_3(j) \ldots g_{2t-1}(j)]$$

where $g_1(j), g_3(j), \ldots g_{2t-1}(j)$ are temporary results from one odd iterative calculation. Each of them is a $1 \times m$ binary matrix and includes m bits.

$R(j)$ is a $1 \times p$ binary matrix, representing received p bits $(r_0(j), r_1(j) \ldots r_{p-1}(j))$ of a codeword by the syndrome computing unit in the $j^{th}$ iterative calculation. It is expressed by a matrix, $$R(j) = [r_0(j) r_1(j) \ldots r_{p-1}(j)].$$

$X_R$ is a $p \times mt$ binary matrix about the inputted codeword. It is expressed as $X_R = [C_1 \ C_3 \ \ldots \ C_{2t-1}]$. $C_{2t-1}$ can be expressed as:

$$C_{2t-1} = \begin{bmatrix} \alpha_0^0 & \alpha_1^0 & \cdots & \alpha_{m-1}^0 \\ \alpha_0^{2t-1} & \alpha_1^{2t-1} & \cdots & \alpha_{m-1}^{2t-1} \\ \vdots & \vdots & \ddots & \vdots \\ \alpha_0^{(p-1)(2t-1)} & \alpha_1^{(p-1)(2t-1)} & \cdots & \alpha_{m-1}^{(p-1)(2t-1)} \end{bmatrix}$$

$\alpha^0 \ldots$ and $\alpha^{(m-1)}$ are elements in $GF(2^m)$.

$X_G$ is a $mt \times mt$ binary matrix, representing fixed multiplications in the method. $X_G$ is shown as below.

$$X_G = \begin{bmatrix} A_{1_p} & 0 & \cdots & 0 \\ 0 & A_{3_p} & \cdots & 0 \\ \vdots & \vdots & \ddots & A_{(2t-3)p} & \vdots \\ 0 & 0 & \cdots & A_{(2t-1)p} \end{bmatrix}$$

$A_{(2t-1)p}$ can be expressed as $$A_{(2t-1)p} = \begin{bmatrix} \alpha_0^{(2t-1)p} & \alpha_1^{(2t-1)p} & \cdots & \alpha_{m-1}^{(2t-1)p} \\ \alpha_0^{(2t-1)p+1} & \alpha_1^{(2t-1)p+1} & \cdots & \alpha_{m-1}^{(2t-1)p+1} \\ \vdots & \vdots & \ddots & \vdots \\ \alpha_0^{(2t-1)p+m-1} & \alpha_1^{(2t-1)p+m-1} & \cdots & \alpha_{m-1}^{(2t-1)p+m-1} \end{bmatrix}$$

$X_S$ is a $mt \times 2mt$ binary matrix. It contains many $m \times m$ unit matrices and $m \times m$ operating matrices. $X_S$ is expressed as below:

$$X_s = \begin{bmatrix} I & B_2 & 0 & B_4 & 0 & 0 & \cdots \\ 0 & 0 & I & 0 & 0 & B_2 & \cdots \\ 0 & 0 & 0 & 0 & I & 0 & \cdots \\ \vdots & \vdots & \vdots & \vdots & \vdots & \vdots & \ddots \end{bmatrix}$$

I is a unit matrix. $B_w$ is a general form of operating matrix $B_2$, $B_4, \ldots$ etc. Numeral w is a positive integer of power of 2 and smaller than or equal to $2t$. $B_w$ can be expressed as:

$$B_w = \begin{bmatrix} \alpha_0^0 & \alpha_1^0 & \cdots & \alpha_{m-1}^0 \\ \alpha_0^w & \alpha_1^w & \cdots & \alpha_{m-1}^w \\ \vdots & \vdots & \ddots & \vdots \\ \alpha_0^{(m-1)w} & \alpha_1^{(m-1)w} & \cdots & \alpha_{m-1}^{(m-1)w} \end{bmatrix}$$

In the paper that Yungjoo Lee provided, it is obvious that the syndrome computing unit according to the method has reduced many common sub-expressions. Now, if the syndrome computing unit can combined with a BCH encoding unit, it is able to reduce area cost of such circuit design.

Based on the above inference, let $$F'' = \begin{bmatrix} F'^T \\ 0 \end{bmatrix}_{(P+mt) \times Rt}. \text{ With } X_{SRG},$$

it is obtained that $Y = [X_{SRG} \ F'']_{(P+mt) \times (3mt+Rt)}$. By applying a circuit for the matrix Y with proper buffers and switches, a co-design circuit for BCH encoding and syndrome computing can be achieved.

Figure 4:
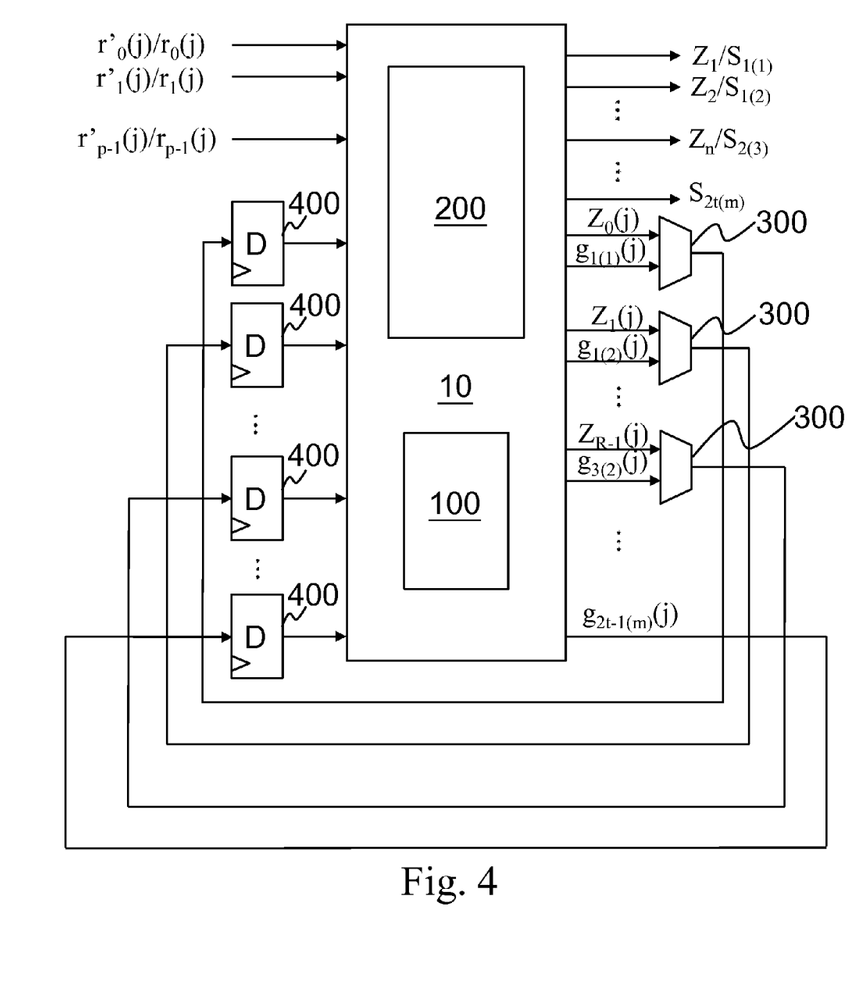
FIG. 4 shows a co-design circuit for BCH encoding and syndrome computing according to the present invention.

Therefore, the present invention provides the co-design circuit for BCH encoding and syndrome computing. Please refer to FIG. 4. FIG. 4 depicts an architecture of a co-design circuit 10 for BCH encoding and syndrome computing. The co-design circuit 10 includes an encoding unit 100, a syndrome computing unit 200, R multiplexers 300 and $t \times m$ registers 400. The co-design circuit 10 can process p parallel computation synchronously. It can be used to encode one message having k bits as a BCH codeword with n bits. It can also be used to process syndrome computing for one received BCH codeword with n bits. BCH encoding and syndrome computing will not conflict by using proper switching circuitry.

The encoding unit 100 can process to obtain computed values of Z(j) and a complete BCH codeword, Z. Therefore, it satisfies operation of matrix F''. Thus, in the $j^{th}$ clock ($j^{th}$ iterative calculation), p inputs ($r'_0(j), r'_1(j), r'_2(j), \ldots$ and $r'_{(p-1)}(j)$) of R'(j) are inputted to the co-design circuit 10 sequentially. By an iterative operation, after $[n/p]$ times of calculations, the complete BCH codeword, Z ($Z_0, Z_1, \ldots$ and $Z_{R-1}$) can be outputted by the co-design circuit 10. Since the encoding and syndrome computing share some multiplexers 300 and registers 400 for respective iterative operations, when receiving signals, it is necessary to distinguish that the signal is for encoding or syndrome computing. The job function is carried out by the multiplexers 300. Please see FIG. 5. After R'(j) is inputted, intermediate computing results, $Z_0(j)$, $Z_1(j), \ldots$ and $Z_{R-1}(j)$ are inputted to different multiplexers 300, respectively. Each multiplexer 300 only chooses the signal form the encoding unit 100 (intermediate computing results) to output, rather than the one from the syndrome computing unit 200 (shown by dashed arrow). The signal outputted from the multiplexers 300, respectively, is inputted to a corresponding register 400. Those registers 400 output the signals to the encoding unit 100 for operation in a $(j+1)^{th}$ clock.

When syndrome computing is required, the syndrome computing unit 200 operates. The syndrome computing unit 200 can process to obtain computed values of G(j) and a complete syndrome, S. Therefore, it satisfies operation of matrix $X_{SRG}$. Thus, in the jth clock (jth iterative calculation), p inputs ($r_0(j), r_1(j), r_2(j), \ldots$ and $r_{(p-1)}(j)$) of R(j) are inputted to the co-design circuit 10 sequentially. By an iterative operation, after [n/p] times of calculations, the complete syndrome S ($S^1(1), S^1(2), \ldots, S^1(2), \ldots S^{2t}(m)$) can be outputted from the co-design circuit 10. Numbers or letters in subscript brackets of S represent one bit of a corresponding syndrome. For example, $S_{2t}(m)$ is the $m^{th}$ bit of the syndrome $S_{2t}$. Since the encoding and syndrome computing share some multiplexers 300 and registers 400 for respective iterative operations, when receiving signals, it is necessary to distinguish that the signal is for encoding or syndrome computing. The job function is also carried out by the multiplexers 300. Please see FIG. 6. After R(j) is inputted, intermediate computing results, $g_{1(1)}(j), g_{1(2)}(j), \ldots$ and $g_{2t-1(m)}(j)$ are inputted to different multiplexers 300, respectively. Each multiplexer 300 only chooses the signal form the syndrome computing unit 200 (intermediate computing results) to output, rather than the one from the encoding unit 100 (shown by dashed arrow). The signal outputted from the multiplexers 300, respectively, is inputted to a corresponding register 400. Those registers 400 output the signals to the syndrome computing unit 200 for operation in a $(j+1)^{th}$ clock. Since there are m×t bits outputted at the same time and the amount is greater than R, some of the outputted values can bypass the multiplexers 300 and are directly inputted to the registers 400. Hence, the amount of the registers 400 should be at least m×t.

Figure 5:
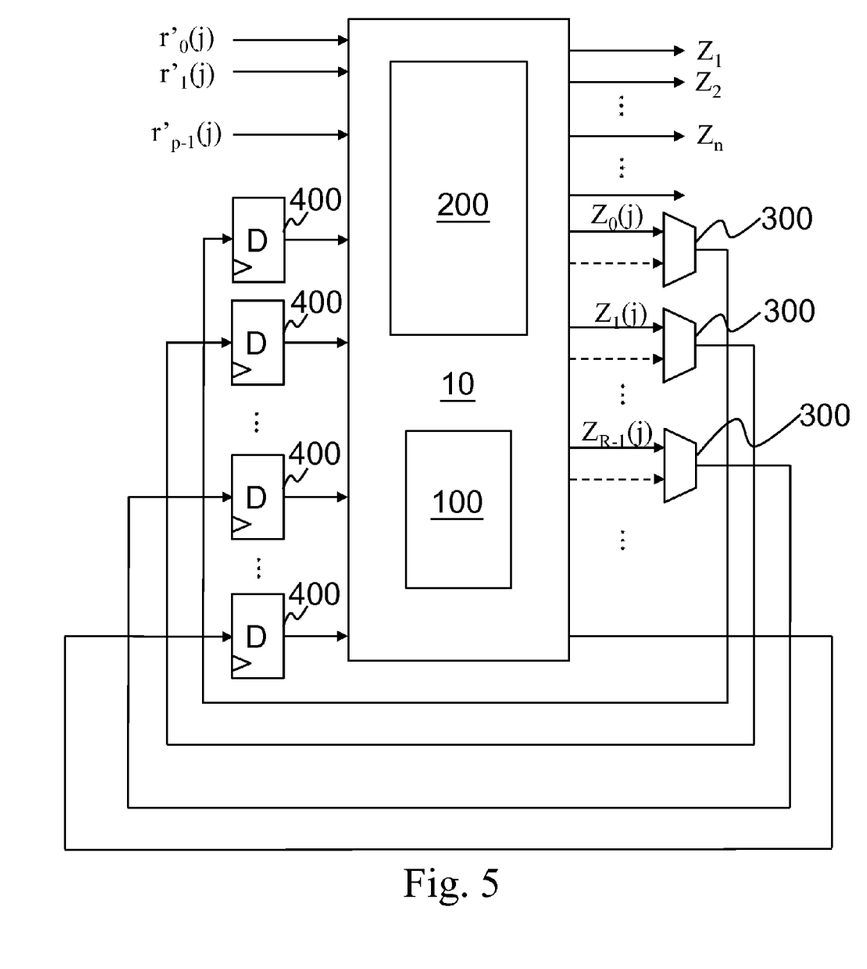
FIG. 5 depicts operation of the co-design circuit for encoding.
Figure 6:
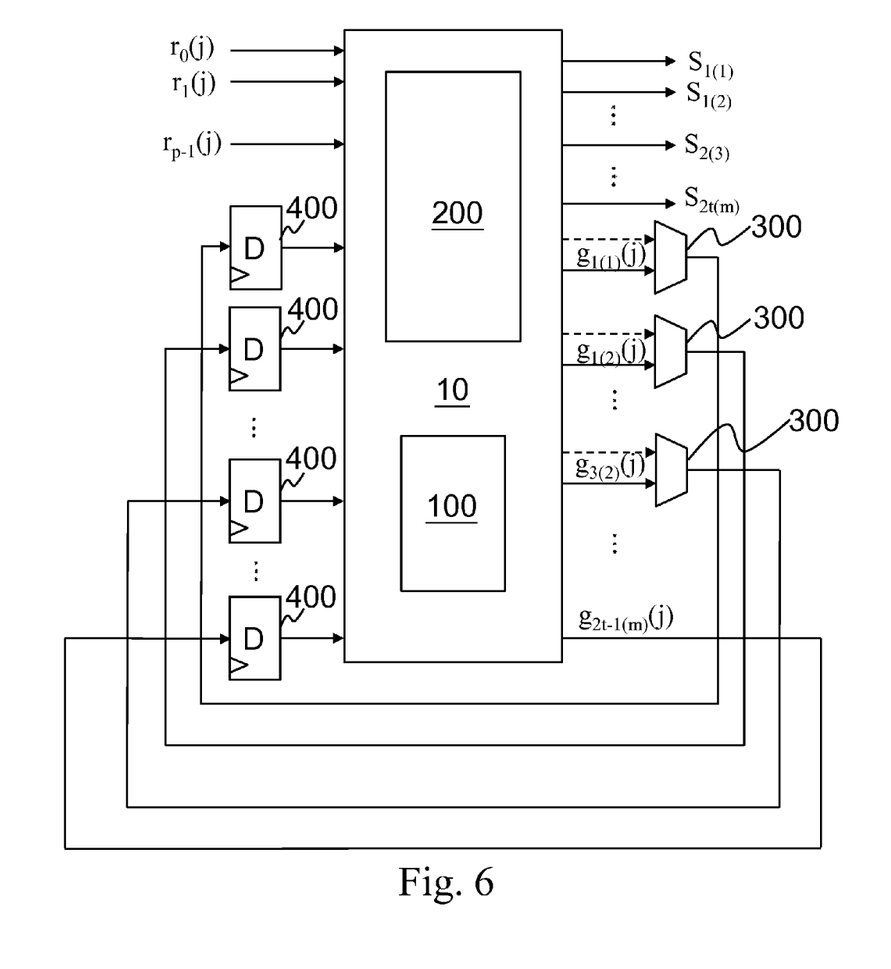
FIG. 6 depicts operation of the co-design circuit for syndrome computing.

Please refer to FIG. 4 again. There are several points to note. First, the present invention can be applied on different BCH encodings. Namely, the code length n and number of bits of the message (k bits) can be changed. R varies accordingly. Meanwhile, because the number of multiplexers 300 relates to R, when it is to design the multiplexers 300, the amount of the multiplexers 300 should be greater than R value of the BCH code which can be encoded by the encoding unit. The number of the multiplexers 300 shown in FIG. 4 to FIG. 6 is only R. In practice, it is not limited to R. Besides, the amount of bits of the syndrome, 2tm, doesn't correspond to code length n. FIG. 4 that shows that 2tm is greater than n is only exemplary. 2tm may be smaller than n. Finally, FIG. 4 shows that $Z_{R-1}(j)$ and $g_{3(2)}(j)$ share the same multiplexer 300. It is inferred that R=m+2. However, it is one of the many designs and not unchangeable. Difference between R and m can be any number.

Figure 7:
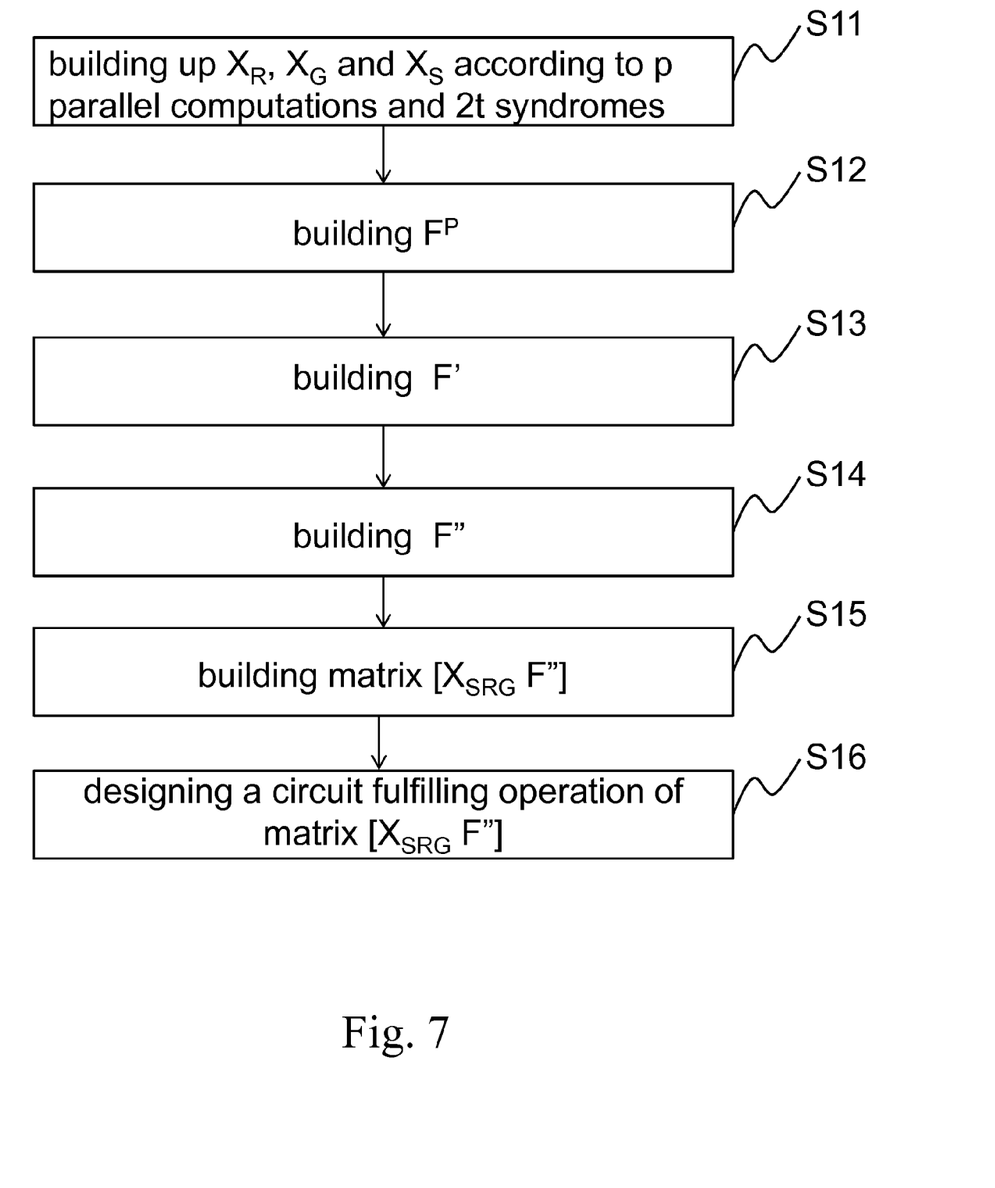
FIG. 7 illustrates a method for deciding the co-design circuit.

According to the introduction of the co-design circuit for BCH encoding and syndrome computing, a method for deciding the co-design circuit can be available as below: First, build up $X_R$, $X_G$ and $X_S$ according to p parallel computations and 2t syndromes (S11). Then, build up $F^P$ (S12), F'(S13) and F''' (S14) sequentially. According to the built matrices, build up matrix [$X_{SRG}$ F''](S15). Finally, design a circuit fulfilling operation of matrix [$X_{SRG}$ F''](S16).

While the invention has been described in terms of what is presently considered to be the most practical and preferred embodiment, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A circuit for BCH encoding and syndrome computing, capable of processing p parallel computation, comprising:

an encoding unit, for encoding one message having k bits as one BCH codeword having n bits after processing a first iterative operation, the first iterative operation being processed to receive p bits sequentially in each clock and output the BCH codeword after [n/p] clocks;

a syndrome computing unit, for obtaining 2t syndromes each having m bits from one BCH codeword having n bits after processing a second iterative operation, the second iterative operation being processed to receive p bits sequentially in each clock and output the syndromes after [n/p] clocks;

a plurality of multiplexers, each being used to receive a first intermediate computing result generated from the first iterative operation and a second intermediate computing result generated from the second iterative operation, wherein when the first iterative operation processes, the first intermediate computing result is outputted, and when the second iterative operation processes, the second intermediate computing result is outputted; and a plurality of registers, each being used to receive the first intermediate computing result or the second intermediate computing result from a corresponding multiplexer, or the second intermediate computing result from a syndrome computing unit, and outputting the first intermediate computing result to the encoding unit or the second intermediate computing result to the syndrome computing unit in a later clock after the first intermediate computing result or the second intermediate computing result is received, wherein k, n, p and t are positive integers, n is greater than k and m is the power of 2 over GF($2^m$).

2. The circuit according to claim 1, wherein the first iterative operation is processed to obtain computed values of Z(j) and a complete BCH codeword, wherein Z(j)=$F^p \times$[Z(j−1)+R'(j)] and all elements in Z(0) are 0, where $$R'(j) = [\, r'_0(j) \quad r'_1(j) \quad r'_2(j) \quad \cdots \quad r'_{p-1}(j) \;|\; 0 \quad \cdots \quad 0\,]^T_{1 \times R},$$

$$F^p = \left| F^{p-1} \times \begin{bmatrix} g'_{R-1} \\ g'_{R-2} \\ \vdots \\ g'_1 \\ g'_0 \end{bmatrix} \right| \text{ first } R-1 \text{ columns of } F^{p-1} \right|,$$

$$F^1 = \begin{bmatrix} g'_{R-1} & 1 & 0 & \cdots & 0 \\ g'_{R-2} & 0 & 1 & \cdots & 0 \\ \vdots & \vdots & \vdots & \vdots & \vdots \\ g'_1 & 0 & 0 & \cdots & 1 \\ g'_0 & 0 & 0 & \cdots & 0 \end{bmatrix},$$

Z(j) is the first intermediate computing results from a $j^{th}$ iterative calculation of the first iterative operation; for a n-bit initial processing data including the k-bit message and being divided per p bits, R'(j) is the $j^{th}$ p bits; R=n−k+1; $g'_{R-1}$, $g'_{R-2}, \ldots$ and $g'_0$ are coefficients of a generating polynomial, $$g(x) = x^R + g'_{R-1} x^{R-1} + g'_{R-2} x^{R-2} + \ldots + g'_2 x^2 + g'_1 x^1 + g'_0.$$

3. The circuit according to claim 2, wherein the first iterative operation satisfies operation of a matrix F''', wherein $$F'' = \begin{bmatrix} F'^T \\ 0 \end{bmatrix}_{(P+mt) \times Rt}, F' = [\text{first } p \text{ columns of } F^p \mid F^p];$$

m is a positive integer.

4. The circuit according to claim 1, wherein the second iterative operation is processed to obtain computed values of G(j) and complete syndromes, wherein $$[S(j)G(j)] = [R(j)G(j-1)] \times \begin{bmatrix} 0 & X_R \\ X_S & X_G \end{bmatrix} = [R(j)G(j-1)] \times X_{SRG},$$

where $G(j)=[g_1(j)\ g_3(j)\ \ldots\ g_{2t-1}(j)]$, G(j) represents m×t second intermediate computing results from a $j^{th}$ iterative calculation of the second iterative operation, $R(j)=[r_0(j)\ r_1(j)\ \ldots\ r_{p-1}(j)]$, R(j) represents p bits of the codeword received by the syndrome computing unit in the $j^{th}$ iterative calculation, S(j) represents outputted computed values of syndromes in the $j^{th}$ iterative calculation; $X_R$ is a p×mt binary matrix; $X_G$ is a mt×mt binary matrix; $X_S$ is a mt×2mt binary matrix.

5. The circuit according to claim 4, wherein the $X_R$, $X_G$ and $X_G$ are defined as:

$$X_R = [\ C_1\quad C_3\quad \cdots\quad C_{2t-1}\ ], \text{ where }$$

$$C_{2t-1} = \begin{bmatrix} \alpha_0^0 & \alpha_1^0 & \cdots & \alpha_{m-1}^0 \\ \alpha_0^{2t-1} & \alpha_1^{2t-1} & \cdots & \alpha_{m-1}^{2t-1} \\ \vdots & \vdots & \ddots & \vdots \\ \alpha_0^{(p-1)(2t-1)} & \alpha_1^{(p-1)(2t-1)} & \cdots & \alpha_{m-1}^{(p-1)(2t-1)} \end{bmatrix},$$

$$X_G = \begin{bmatrix} A_{1_p} & 0 & \cdots & 0 \\ 0 & A_{3_p} & \cdots & 0 \\ \vdots & \vdots & \ddots A_{(2t-3)p} & \vdots \\ 0 & 0 & \cdots & A_{(2t-1)p} \end{bmatrix},$$

$$A_{(2t-1)p} = \begin{bmatrix} \alpha_0^{(2t-1)p} & \alpha_1^{(2t-1)p} & \cdots & \alpha_{m-1}^{(2t-1)p} \\ \alpha_0^{(2t-1)p+1} & \alpha_1^{(2t-1)p+1} & \cdots & \alpha_{m-1}^{(2t-1)p+1} \\ \vdots & \vdots & \ddots & \vdots \\ \alpha_0^{(2t-1)p+m-1} & \alpha_1^{(2t-1)p+m-1} & \cdots & \alpha_{m-1}^{(2t-1)p+m-1} \end{bmatrix},$$

$$X_S = \begin{bmatrix} I & B_2 & 0 & B_4 & 0 & 0 & \cdots \\ 0 & 0 & I & 0 & 0 & B_2 & \cdots \\ 0 & 0 & 0 & 0 & I & 0 & \cdots \\ \vdots & \vdots & \vdots & \vdots & \vdots & \vdots & \ddots \end{bmatrix}, \text{ and}$$

$$B_w = \begin{bmatrix} \alpha_0^0 & \alpha_1^0 & \cdots & \alpha_{m-1}^0 \\ \alpha_0^w & \alpha_1^w & \cdots & \alpha_{m-1}^w \\ \vdots & \vdots & \ddots & \vdots \\ \alpha_0^{(m-1)w} & \alpha_1^{(m-1)w} & \cdots & \alpha_{m-1}^{(m-1)w} \end{bmatrix},$$

wherein $\alpha_0 \ldots$ and $\alpha_{(m-1)}$ are elements in GF($2^m$), I is a unit matrix, $B_w$ is an operating matrix other than a zero matrix and a unit matrix, w is an positive integer of power of 2 and smaller than or equal to 2t.

6. The circuit according to claim 1, wherein the amount of multiplexers is greater than R value of the BCH code which can be encoded by the encoding unit, where R=n−k+1.

7. The circuit according to claim 1, wherein the amount of the registers is greater than or equal to m×t.

8. The circuit according to claim 1, wherein the first intermediate computing result is a one bit signal and the second intermediate computing result is a one bit signal.

\* \* \* \* \*